US012772481B2

(12) United States Patent
Cetnar et al.

(10) Patent No.: US 12,772,481 B2
(45) Date of Patent: Oct. 20, 2026

(54) LOW POWER SMITH-PURCELL RADIATION SOURCES BASED ON HIGH ELECTRON MOBILITY TRANSISTOR STRUCTURES

(71) Applicant: Government of the United States as Represented by the Secretary of the Air Force, Wright-Patterson AFB, OH (US)

(72) Inventors: John S Cetnar, West Manchester, OH (US); David H Tomich, New Carlisle, OH (US); Shivashankar R Vangala, Mason, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 617 days.

(21) Appl. No.: 18/167,045

(22) Filed: Feb. 9, 2023

(65) Prior Publication Data

US 2023/0327011 A1 Oct. 12, 2023

Related U.S. Application Data

(60) Provisional application No. 63/308,173, filed on Feb. 9, 2022.

(51) Int. Cl.

| | |
|---|---|
| ***H10D 30/47*** | (2025.01) |
| ***H10D 30/01*** | (2025.01) |
| ***H10D 62/85*** | (2025.01) |

(52) U.S. Cl.

CPC ......... *H10D 30/475* (2025.01); *H10D 30/015* (2025.01); *H10D 62/8503* (2025.01)

(58) Field of Classification Search

CPC ..................... H10D 30/47–485; H10D 30/015

See application file for complete search history.

(56) References Cited

U.S. PATENT DOCUMENTS

| | | | | |
|---|---|---|---|---|
| 5,698,870 A | 12/1997 | Nakano et al. | | |
| 9,385,321 B1 | 7/2016 | Smith | | |
| 10,964,733 B2 | 3/2021 | Moens et al. | | |
| 2005/0258450 A1* | 11/2005 | Saxler | ................ | H10D 30/4755 257/E29.05 |
| 2007/0194354 A1* | 8/2007 | Wu | ...................... | H10D 64/111 257/E29.093 |
| 2011/0241020 A1 | 10/2011 | Saunier | | |

(Continued)

OTHER PUBLICATIONS

Cetnar, John S., David H. Tomich, and Don D. Smith, "Tunable Room Temperature Solid State THz Source Based on Smith-Purcell Radiation", Aerospace and Electronics Conference (NAECON), 2016 IEEE National, pp. 452-457. IEEE (2016).

(Continued)

*Primary Examiner* — Christine S. Kim
*Assistant Examiner* — Cole Leon Lindsey
(74) *Attorney, Agent, or Firm* — AFMCLO/JAZ; Eugene P. Sunday

(57) ABSTRACT

A high electron mobility transistor (HEMT) structure configured to generate a two-dimensional electron gas (2DEG) combined with a grating structure which interacts with the 2DEG when a bias voltage is applied across the HEMT structure to responsively generate Smith-Purcell radiation.

9 Claims, 11 Drawing Sheets

(56) References Cited

U.S. PATENT DOCUMENTS

2016/0233379 A1* 8/2016 Qin ...................... H10H 20/062
2019/0267468 A1* 8/2019 Ni ......................... H01L 21/308

OTHER PUBLICATIONS

Smith, Stephen Judson, and E. M. Purcell, "Visible light from localized surface charges moving across a grating." Physical Review 92.4 (1953): 1069.
D. D. Smith, Theory and Design of Smith-Purcell Semiconductor Terahertz Sources (Doctoral dissertation), Texas A&M University, Dissertation (2013).
Matthew Hardy, "Scandium Aluminum Nitride as an Emerging Material for High Power Transistors," IEEE MTT-S International Microwave Workshop Series on Advanced Materials and Processes for RF and THz Applications (IMMS-AMP 2018), Jul. 16-18, 2018, Ann Arbor, MI, USA.
Smith, "Grating-Induced Frequency Multiplication in Planar Gunn Diodes," 2015 IEEE Compound Semiconductor Integrated Circuit Symposium (CSICS).

* cited by examiner

400

LOW POWER SMITH-PURCELL RADIATION SOURCES BASED ON HIGH ELECTRON MOBILITY TRANSISTOR STRUCTURES

CROSS-REFERENCE TO RELATED APPLICATIONS

This application claims priority to U.S. Provisional Application No. 63/308,173, filed on Feb. 9, 2022, which is incorporated herein by reference in its entirety.

GOVERNMENT INTEREST

The invention described herein was made by employees of the United States Government and may be manufactured and used by or for the Government of the United States of America for governmental purposes without the payment of any royalties thereon or therefore.

FIELD OF THE DISCLOSURE

The present disclosure generally relates to electromagnetic radiation sources, and more particularly, to solid state electromagnetic radiation sources that generate Smith-Purcell radiation.

BACKGROUND

Current solid state electromagnetic (EM) radiation sources in the mmWave region tend to be semiconductor device-based and are characterized by steep output power and conversion efficiency roll-offs with increasing output frequency. Conventional EM radiation sources are usually not dynamically tunable and often suffer from high phase noise. Meanwhile, compact terahertz (THz) sources tend to be laser or photonics-based devices (photomixers) that suffer from significant power and conversion efficiency roll-offs with increasing wavelength and are not usually dynamically tunable. In addition, many of these devices, such as quantum cascade and semiconductor lasers, do not operate at room temperature in the THz region. Examples of conventional technology include U.S. Pat. No. 9,385,321 entitled “Real Space Charge Transfer Device and Method Thereof.” Another example is paper: Cetnar, John S., David H. Tomich, and Don D. Smith, “Tunable Room Temperature Solid State THz Source Based on Smith-Purcell Radiation”, Aerospace and Electronics Conference (NAECON), 2016 IEEE National, pp. 452-457. IEEE (2016).

Yet, there is a need for improved devices that overcome the various deficiencies of these conventional devices.

SUMMARY OF THE INVENTION

Various deficiencies in the prior art are overcome by a device including a high electron mobility transistor (HEMT) structure (not necessarily a transistor since there is no need for a gate) that generates a two-dimensional electron gas (2DEG) having a high sheet charge density and can therefor conduct large currents. The HEMT structure is combined with a grating structure that interacts with the 2DEG when a bias voltage is applied across the HEMT structure and responsively generates Smith-Purcell radiation (i.e., an electron beam moving across a grating type structure generates Smith-Purcell radiation; the closer the beam is to the grating structure, the stronger the interaction).

Various embodiments provide Smith-Purcell radiation (SPR) devices and methods of manufacture thereof, the HEMT structure (e.g., an ungated HEMT) integrated with a periodic metallic grating structure (e.g., a nanograting structure), wherein the HEMT structure is configured to generate a 2DEG that upon electrical bias interacts with the periodic metallic grating structure by inducing a surface current thereat which causes radiation emission at grating discontinuities in accordance with the Smith-Purcell effect.

An electromagnetic (EM) radiation device according to one embodiment comprises a HEMT layered semiconductor structure having a drain and a source and configured to generate at a conducting channel of a buffer layer, a 2DEG in response to a voltage applied between the drain and source; and a periodic metallic grating disposed upon the HEMT and configured to interact with the generated 2DEG to emit EM radiation in response to surface currents induced upon the periodic metallic grating by the 2DEG, the frequency of the EM radiation being determined by a grating period of the periodic metallic grating and by the velocity of the electrons conducted in the channel (the electrical current).

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
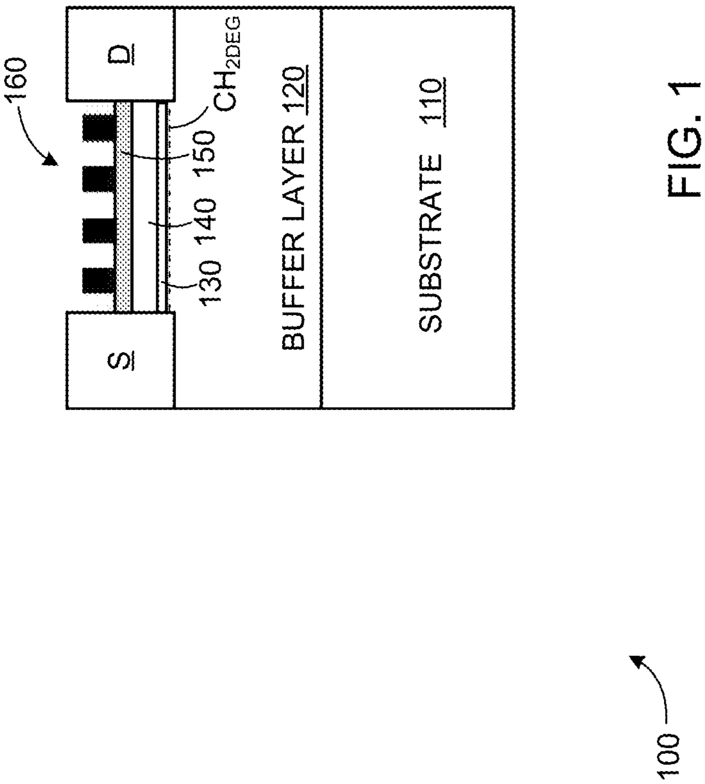
FIG. 1 schematically illustrates a cross-sectional view of a semiconductor device, in accordance with various embodiments of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art and are to be construed as being without limitation to such specifically recited examples and conditions. Additionally, the term, “or,” as used herein, refers to a non-exclusive or, unless otherwise indicated (e.g., “or else” or “or in the alternative”). Also, the various embodiments described herein are not necessarily mutually exclusive, as some embodiments can be combined with one or more other embodiments to form new embodiments.

The numerous innovative teachings of the present invention will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments, such as seismology and data fusion.

There currently exists a gap between microwave sources (solid state devices) and infrared sources (photonic devices). This is a major cause of what is commonly known as the “THz gap.” Solid state microwave sources are characterized by decreasing output power and efficiency as the frequency increases into the THz region. Meanwhile, with photonic infrared sources, as frequency goes down (wavelength increases) into the THz region the efficiency and power output also goes down. These devices also need cooling such as with liquid nitrogen (not room temperature). The various embodiments of the present invention fill this gap by providing a compact, tunable, source of coherent terahertz radiation that operates at room temperature.

The various embodiments provide a device including a high electron mobility transistor (HEMT) structure (not necessarily a transistor since no need for a gate) that generates a two-dimensional electron gas (2DEG) that has a high sheet charge and can, therefor, conduct large currents. The HEMT structure is combined with a grating structure. When a bias voltage is applied across the drain and source of the HEMT structure, the current generated within the 2DEG interacts with the grating structure and responsively generates Smith-Purcell radiation (i.e., an electron beam moving across a grating-type structure generates Smith-Purcell radiation; the closer the beam is to the grating-type structure, the stronger the interaction).

The device operates at room temperature and is frequency tunable. The radiating frequency of the device may be tuned (modulated) by changing the spacing of the nanograting. Some tuning may also be possible via modulating the biasing of the HEMT structure so as to control the amount of current going through the HEMT structure, but this will also be material dependent due to the drift velocity. Standard lithography may be used, with an additional step of combining the nanograting with the HEMT structure.

Aspects of the present disclosure provide: (i) solid state sources of coherent Smith-Purcell radiation in the millimeter wave (mmWave) and terahertz (THz) regions of the electromagnetic spectrum; (ii) tunable, compact solid-state sources of mmWave and THz radiation that operate at room temperature (RT) that are otherwise not readily available; (iii) use in the next generation of mmW/THz receivers and positioning, navigation, and timing (PNT) electronics; and (iv) compact, tunable sources of radiation that operate at room temperature and that have an output power that is not inherently dependent on frequency.

Various embodiments are directed to forming in integrated circuit having a HEMT structure including or integrated with a periodic metallic grating structure wherein the periodic metallic grating is disposed (e.g., deposited, patterned, etc. as appropriate) on or within the integrated circuit proximate a portion of the HEMT structure generating a 2DEG such that when electrically-biased the periodic metallic grating structure responsively generates far-field electromagnetic radiation in accordance with the Smith-Purcell effect. For example, in one embodiment, a HEMT structure generates the 2DEG. The HEMT structure is a layered semiconductor structure that consists of a SiC substrate, a GaN buffer layer (typically less than 1 μm thick) of which the top will form the conducting channel, a AlN spacer interlayer (~3 nm thick), an AlGaN barrier layer (10 nm to 20 nm thick), and a SiN cap. Source and drain Ohmic contacts connect directly to 2DEG and consist of n++ GaN layers having metal deposited thereupon (e.g., Au/Ti). The device may operate in depletion mode. On top of the insulating SiN layer, a periodic metallic grating may be added directly above the 2DEG. The period of the grating is selected according to the desired frequency of operation. It is noted that the GaN buffer layer may typically be between 1 nm and 4 nm, if used, and potentially 0 nm (i.e., if no spacer layer) when AlN is used as a barrier layer.

Figure 2:
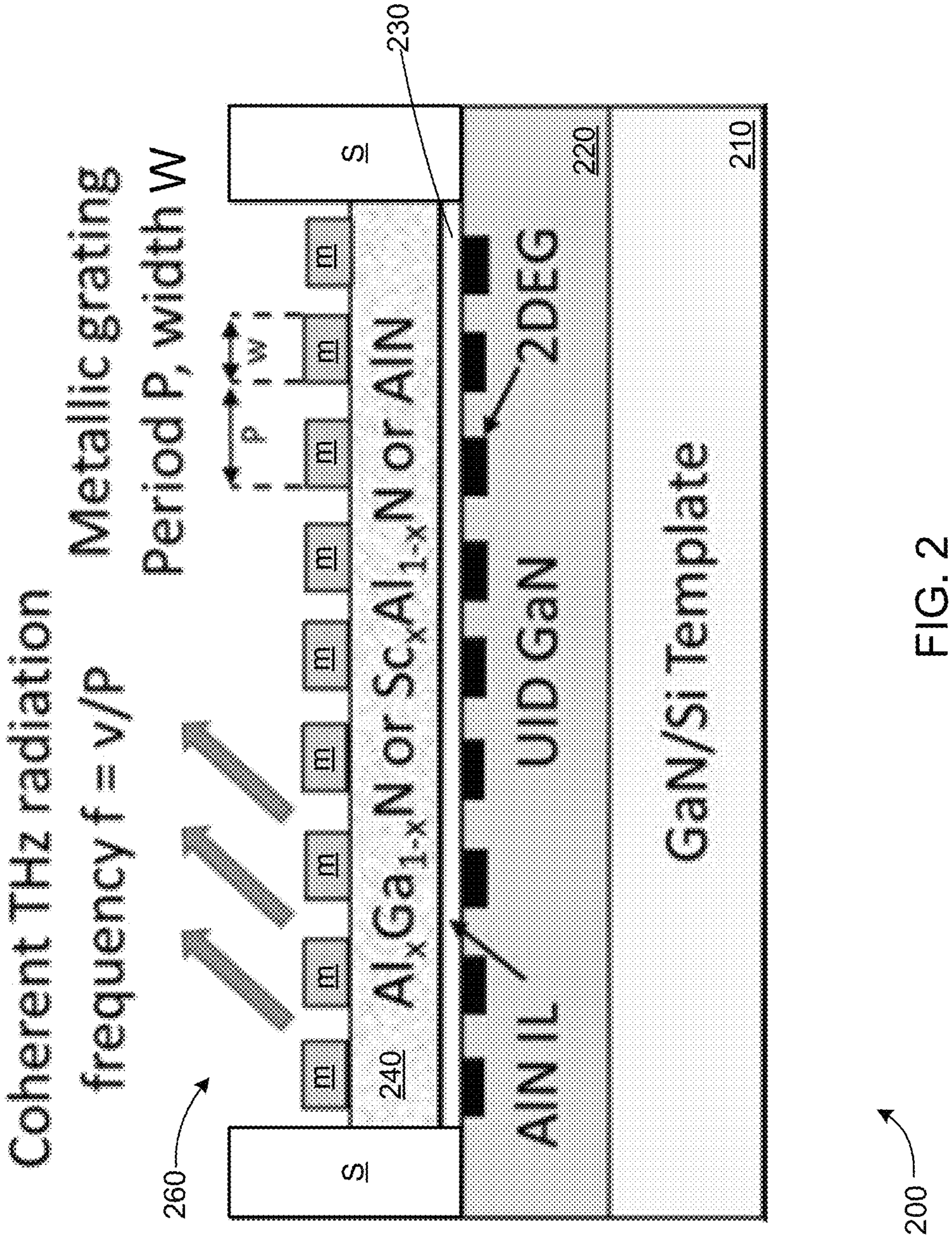
FIG. 2 schematically illustrates a cross-sectional view of another semiconductor device, in accordance with various embodiments of the present invention.

FIGS. 1 and 2 schematically illustrate cross-sectional views of first and second semiconductor devices 100, 200 in accordance with various embodiments. In particular, FIGS. 1 and 2 schematically illustrate cross-sectional views of Smith-Purcell radiation (SPR) devices 100, 200 according to various embodiments. As will be discussed in more detail below, each of the SPR devices 100, 200 comprises a HEMT structure (e.g., an ungated HEMT) integrated with a periodic metallic grating structure (e.g., a nanograting structure), wherein the HEMT structure is configured to generate a 2DEG that upon electrical biasing interacts with the periodic metallic grating structure by inducing a surface current thereat which causes EM radiation emission at grating discontinuities in accordance with the Smith-Purcell effect. The frequency of the EM radiation is determined by a grating period of the periodic metallic grating.

While FIGS. 1 and 2 depicts SPR devices 100, 200 configured in accordance with exemplary HEMT structures with nanograting structures, it will be appreciated by those of ordinary skill in the art having the benefit of the disclosure herein that different types and combinations of HEMT structures and periodic metallic grating structures may be used in the various embodiments. For example, while the periodic metallic grating structures discussed herein comprise nanograting structures, it is noted that other conductive structures configured to generate electromagnetic radiation in accordance with the Smith-Purcell effect may be used; generally speaking, any conductive media having periodic conductive sub-structures or discontinuities configured to scatter induced charge field thereat.

As depicted in FIG. 1, the device 100 having the exemplary HEMT structure 110-150 comprises a substantially planar and elongated layered semiconductor structure comprising a substrate 110 (e.g., SiC-6H, silicon (Si), sapphire ($Al_2O_3$), and gallium oxide ($Ga_2O_3$), etc.) upon which is formed or disposed an epilayer stack including a GaN buffer layer 120 (typically less than 1 μm thick) of which the top will form a conducting channel supporting flow for a generated 2DEG thereat. A spacer interlayer 130 (e.g., an AlN layer approximately 3 nm thick) is formed or disposed upon a first portion of the buffer layer 120. A barrier layer 140 (e.g., an AlGaN layer approximately 10 nm to 20 nm thick) is formed or disposed upon the spacer interlayer 130. A cap 150 (e.g., a SiN insulating cap) is formed or disposed upon the barrier layer 140.

Source (S) and drain (D) regions or contacts are formed upon respective second and third portions of the buffer layer 120 such that the first portion of the buffer layer 120 is generally disposed between the second and third portions of the buffer layer 120. The source (S) and drain (D) Ohmic contacts connect directly to the generated 2DEG and are configured to operate the HEMT structure 110-150 in a depletion mode (e.g., n++ GaN layers having metal deposited thereupon, e.g., Au/Ti).

A periodic metallic grating 160 is added to the cap 150, directly above and electrically cooperating with the 2DEG channel $CH_{2DEG}$ and comprises a plurality of metallic elements of width (W) (FIG. 2) having a spacing of period (P). The period of the grating is selected according to a desired frequency of operation.

It is noted that coherent SPR may be generated by passing a free-space electron beam over a diffraction grating in a direction that is perpendicular to the grating rulings. Smith and Purcell found that the wavelength (λ) of the resultant emission varied as:

$$\lambda = \frac{l}{m}(\beta^{-1} - \sin\theta)$$

where l is the grating period, m is the grating order, β=v/c (v the electron velocity, c the speed of light in vacuum), and θ the angle of observation.

For radiation normal to the plane of the grating (θ=0°) and a grating order of m=1, this equation simplifies and can be rearranged into the following (which is the basic design equation for the SPR-devices discussed herein):

$$f = \frac{v}{l}$$

Thus, the frequency of the emitted radiation is a function of the electron velocity divided by the length of the grating period. To increase the radiated frequency one can either increase the electron velocity, reduce the grating period, or both. Conversely, decreasing the frequency can be done by decreasing the electron velocity, increasing the grating period, or both. This results in SPR devices that are tunable by changing the grating geometry or by modulating the electron velocity.

Further studies have shown that the radiated power from Smith-Purcell systems varies with the distance between the moving charges and the grating (impact factor, b, which is related to the distance between the electron beam and the grating), the number of charges (N), and the velocity of the charges v as:

$$P_{SPR} = CN^2v^4\exp(-\alpha b)$$

where C and α are functions of an experimental setup used by the inventors.

Since the radiated power in SPR has an exponential dependence on the impact parameter, reducing the impact parameter is the key to increasing performance. In addition, the radiated power is independent of frequency. This gives devices emitting SPR an inherent advantage over many state-of-the-art radiation sources and oscillators.

Coherent SPR is ideally generated using a semiconductor device rather than a vacuum (free space) device because the semiconductor approach enables better control of the impact parameter. Electron velocities in vacuum are ballistic and can be relativistic. Generation of electron bunching, which results in coherent radiation, is not difficult to achieve under these conditions given a strong enough applied electric field (E-field). On the other hand, electron velocities in semiconductors are neither ballistic nor relativistic. The velocity of charge carriers in a semiconductor, referred to as the drift velocity, is limited due to scattering by impurities and phonons. Further, E-field strength is limited by the material's breakdown voltage. No bunching has ever been observed for electrons propagating in semiconductors because, even in the highest mobility semiconductors, the drift velocity is too low.

In a semiconductor, a current of charge carriers is a proxy for the electron beam in a vacuum. The current is determined by the number and drift velocity of the charge carriers. The drift velocity is a function of the applied E-field and the electron mobility. The relation is given as:

$$v_d = \mu_e E$$

where $\mu_e$ is the electron mobility and E is the magnitude of the applied E-field.

Mobility is typically a complex function of several other material properties and scattering mechanisms. In addition, every semiconductor has a maximum drift velocity (saturation velocity, $v_{sat}$) beyond which no electron may be accelerated, irrespective of the applied field strength. Nominally, a given applied E-field will generate a given electron drift velocity that increases with increasing field strength up to $v_{sat}$.

To achieve a very large saturation velocity, devices according to various embodiments use the 2DEG formed at the heterojunction of the HEMT structure. The key to this approach is to design the 2DEG with electron mobility and sheet charge density high enough so that a very large number of charge carriers can be accelerated to the material's saturation velocity. If the 2DEG is in close proximity to the gratings, and the region of interaction is long enough, it is possible that the high number of fast-moving electrons and the grating EM modes will mutually couple and lead to self-amplification and thus coherent SPR. A schematic for this structure is discussed below with respect to FIG. 2.

As depicted in FIG. 2, a device 200 having an exemplary HEMT structure (210-240) is shown and comprises a layered semiconductor structure comprising a template 210 (e.g., GaN/Si) upon which is grown an unintentionally doped (UID) GaN channel 220, upon which is grown a barrier layer 240 (e.g., $Al_xGa_{1-x}N$, or $Sc_xAl_{1-x}N$, or AlN, etc.). A metallic grating disposed upon the barrier layer 240 of the HEMT structure comprises a plurality of metallic elements (m) of width (W) having a spacing of period (P). The period of the grating is selected according to a desired frequency of operation.

A source (S) ohmic contact is formed between a proximate portion of the UID GaN channel 220 and the barrier layer 240, while a drain (D) ohmic contact is formed between a distal portion of the UID GaN channel 220 and the barrier layer 240. In the case of the barrier layer 240 comprising $Al_xGa_{1-x}N$, $Sc_xAl_{1-x}N$, or similar, an interlayer 230 (e.g., AlN) may be formed on the UID GaN channel 220 prior to the forming of the barrier layer 240. In the case of the barrier layer 240 comprising AlN, an interlayer 230 need not necessary or required.

In this schematic, the barrier layer 240 is grown on the UID GaN channel 220 to form the 2DEG at the heterojunction. In UID GaN, the 2DEG has a measured saturation drift velocity of $v_{sat}$=2.5e7 cm/s (2.5e5 m/s). The THz region can be roughly defined to range from 300 GHz to 3 THz. For these applications, the interest is in devices emitting from 300 GHz to 1 THz. To produce coherent radiation within this frequency range with this saturation velocity, the grating periods should range from 833 nm to 250 nm as shown in the Table 1 below.

TABLE 1

| Saturation Velocity (cm/s) | Grating Period (nm) | Emitted Frequency (GHz) |
|---|---|---|
| 2.5e7 | 833 | 300 |
| 2.5e7 | 250 | 1,000 (1 THz) |

The grating period can be scaled between these two extrema to achieve intermediate frequencies, and such scaling is contemplated by the inventors in various embodiments.

Various embodiments may use differing barrier materials, such as $Al_xGa_{1-x}N$, $Sc_xAl_{1-x}$ N, and AlN. These three materials have been chosen due their ability to create 2DEGs with high mobilities and high sheet charge densities on UID GaN channels and provide high break down voltages. One particular embodiment would include material that can be the thinnest for the applied field with the greatest sheet charge density. A plot of the sheet charge density ($n_s$) versus barrier thickness is shown in FIG. 3.

Figure 3:
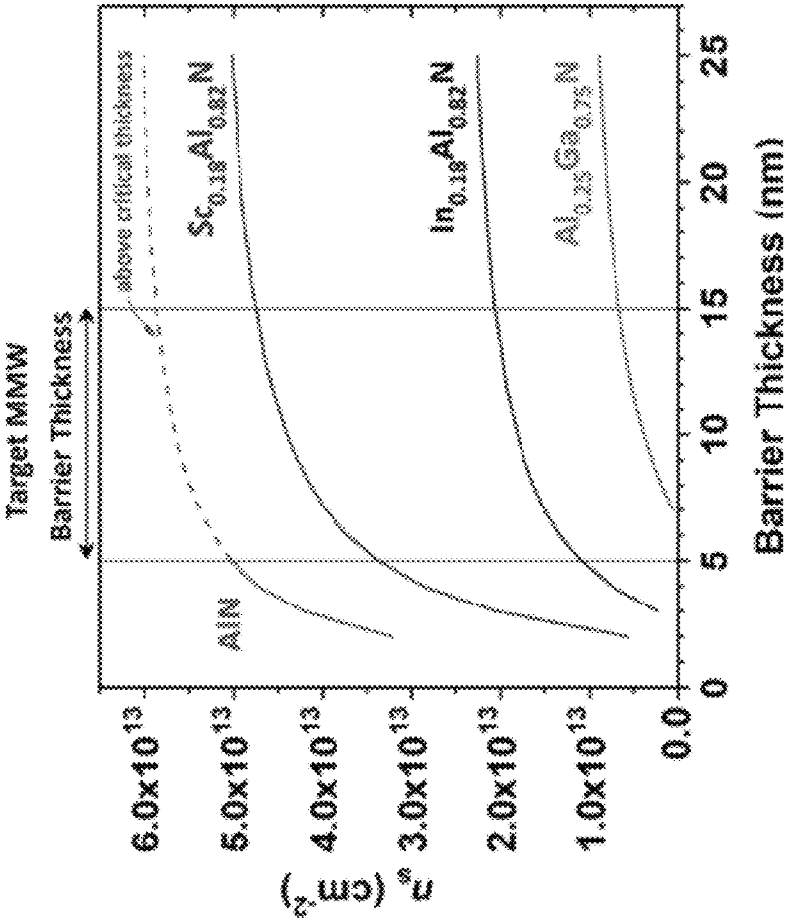
FIG. 3 depicts sheet charge density ($n_s$) as a function of barrier thickness for various embodiments of the present invention.

As can be seen in FIG. 3, AlN gives the largest sheet charge density of the three materials systems, but is limited by a critical thickness of 5 nm. Nonetheless, with the an AlN formed barrier layer 240, no interlayer 230 is needed or required. Further, it is possible that the barrier layer 240 may not need to be very thick. In various embodiments it can function well below the critical thickness. If so, this will result in the greatest possible sheet charge densities and the smallest thicknesses of any of the barrier materials. Minimizing the thickness of the barrier layer 240 is very important in this design as the thickness of the barrier (and the interlayer for the AlGaN and ScAlN configurations) defines the impact factor b. $Sc_xAl_{1-x}N$ gives the second largest sheet charge density and has the added advantage of being lattice matched to GaN when the composition X=0.18. Further, there is more flexibility with the $Sc_xAl_{1-x}N$ barrier thickness. It can be grown thicker than 5 nm, if needed, to achieve greater sheet charge densities. AlGaN gives the smallest sheet charge density of the three barriers but is the most common and well understood barrier material used in GaN technology. In the various embodiments, the barrier layer 240 may alternatively comprise, AlN or ScAlN or ScAlGaN or other materials of this type. The thickness of an AlN formed barrier layer 240 may be less than 5 nm. The thickness of a ScAlN form barrier layer may be range from 10 nm to 25 nm.

A variety of substrates 110, 210 are suitable upon which to build devices 100, 200 according to various embodiments of the present invention. Suitable materials may include GaN, GaN on silicon (GaN/Si), GaN on silicon carbide (GaN/SiC), GaN on sapphire ($GaN/Al_2O_3$), and GaN on gallium oxide ($GaN/Ga_2O_3$). Each has its own advantages and disadvantages relative to the others in terms of cost, heat dissipation, and compatibility for heterogenous integration with other material systems.

In the embodiments of FIGS. 1 and 2, and in response to a voltage applied across the source and drain connections of the device 100, 200, a large current will flow in the channel $CH_{2DEG}$. The amount of current will be determined by the carrier concentration and electron drift velocity in the channel $CH_{2DEG}$. The carrier concentration is determined by impurity doping within the barrier layer 140, 240. The drift velocity is determined by the applied voltage and the channel material. It is noted that materials such as GaN have a high drift velocity and are often used as channel/buffer layers in HEMT devices. Due to the high drift velocity of the electrons flowing in the channel and their proximity to the metallic grating, the moving charges will interact with the EM modes of the grating. The interaction will increase with time and distance along the grating. When the interaction becomes strong enough, a mutual coupling between the electrons on the grating EM modes will occur generating coherent Smith-Purcell Radiation. The frequency (f) of the radiation will be proportional to the electron velocity (v) and inversely proportional to the grating period (p), given by f=v/p. In one or more embodiments, the configuration of the device is an AlGaN/GaN HEMT structure without a gate.

An AlGaN/GaN HEMT structure on a SiC substrate may be grown using a relatively standard Metal Organic Chemical Vapor Deposition (MOCVD) process. The addition of the n++ layers for ohmic contacts (e.g., having metal deposited thereupon such as Au/Ti) may be achieved using, illustratively, Molecular Beam Epitaxy (MBE).

Standard semiconductor fabrication processes such as planar processes, lithographic processes, and the like may be used for device fabrication. This includes defining mesas, adding contacts, and depositing dielectric layers. Mask development will proceed processing to insure manufacturability and testability of the prototype devices. The grating pattern will be deposited on the top metal layer via Au (gold) metallization, with the pattern being defined with E-Beam Lithography or a NanoFrazor 3D writer for each device (mmW or THz). Alternative configurations include adding a gate to the HEMT structure. In this configuration, the periodic metallic grating structure is placed on the top surface of the device 100, 200 between the gate and the drain.

Figure 4:
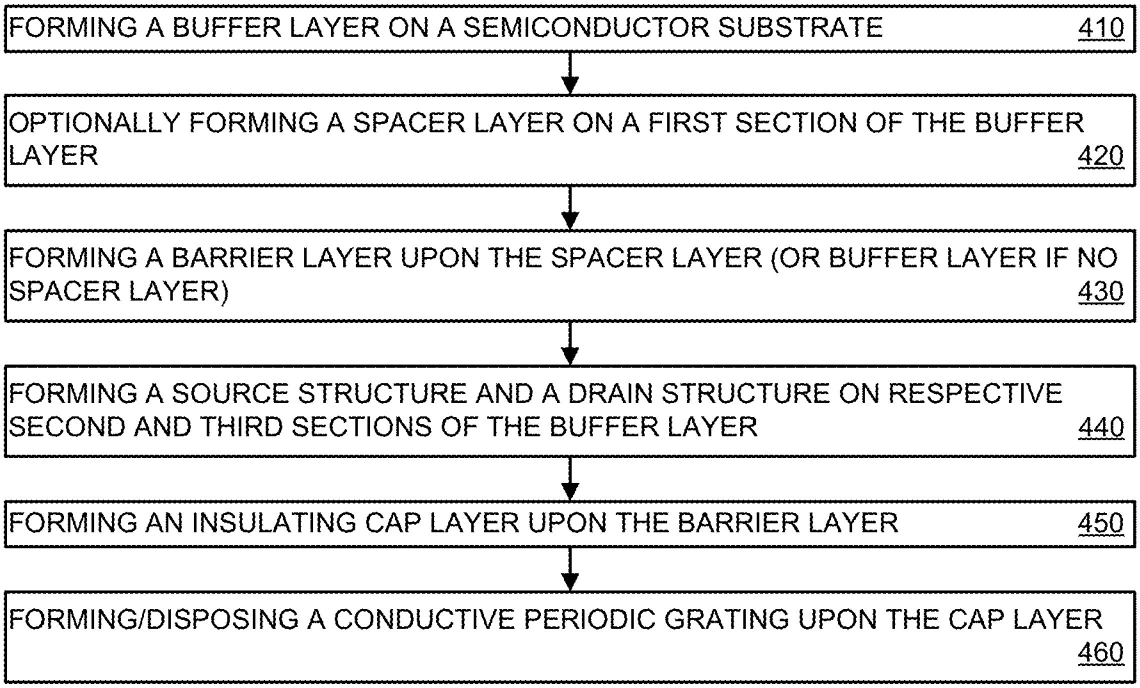
FIG. 4 illustrates a method for fabricating a semiconductor device on a semiconductor substrate, in accordance with various embodiments of the present invention.

FIG. 4 illustrates a method for fabricating a semiconductor device 100, 200 of FIGS. 1 and 2 (e.g., a combined or integrated HEMT/nanograting) on a semiconductor substrate 110, 210, in accordance with various embodiments of the present disclosure. In particular, the method 400 of FIG. 4 is suitable for use in forming EM radiation devices such as discussed herein with respect to the various figures. Any semiconductor fabrication process suitable for use in forming a gateless or gated HEMT and the like may be used within the context of the method 400 of FIG. 4.

As step 410, the buffer layer 120, 220 is formed on a semiconductor substrate 110, 210.

As step 420, the optional spacer layer 130, 230 is formed on a first portion of the buffer layer 120, 220.

As step 430, the barrier layer 140, 240 is formed upon the spacer layer 130, 230, if present, or the buffer layer 120, 220.

As step 440, the source (S) and the drain (D) structure are formed on respective second and third portions of the buffer layer 120, 140.

As step 450, an insulating cap layer is formed upon the barrier layer, such as discussed with respect to the various figures.

As step 460, a conductive periodic grating is formed or disposed upon the cap layer, such as discussed with respect to the various figures.

Figure 5A:
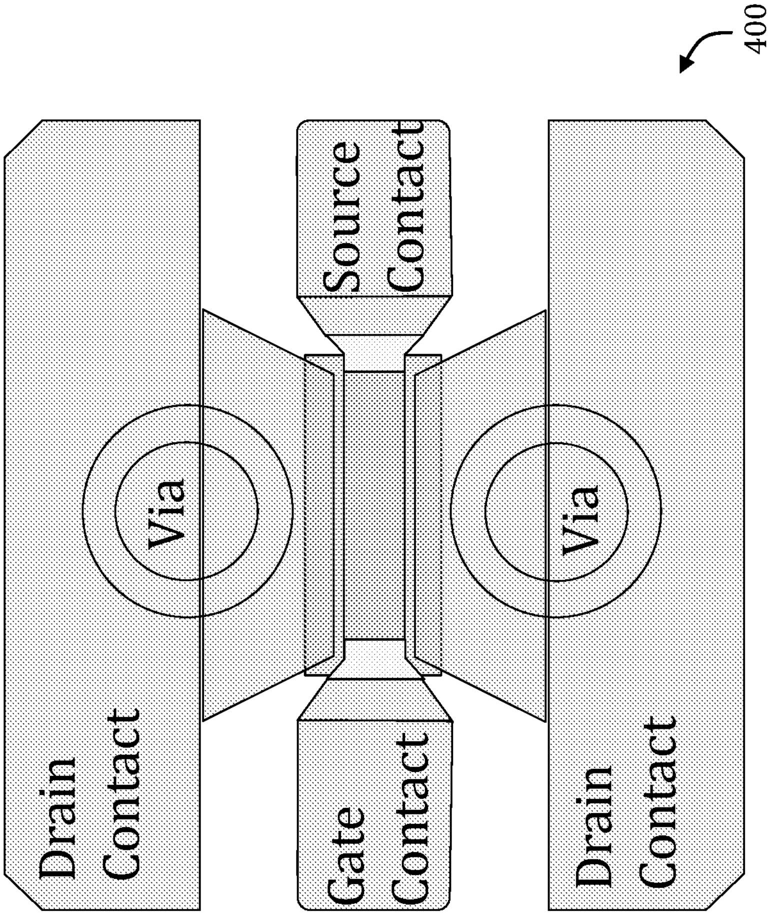
FIG. 5A is a top view of an exemplary Smith-Purcell radiation (SPR) device formed using a high electron mobility transistor (HEMT) structure.

FIG. 5A depicts a top view of an exemplary Smith-Purcell radiation (SPR) device formed using a HEMT structure.

Figure 5B:
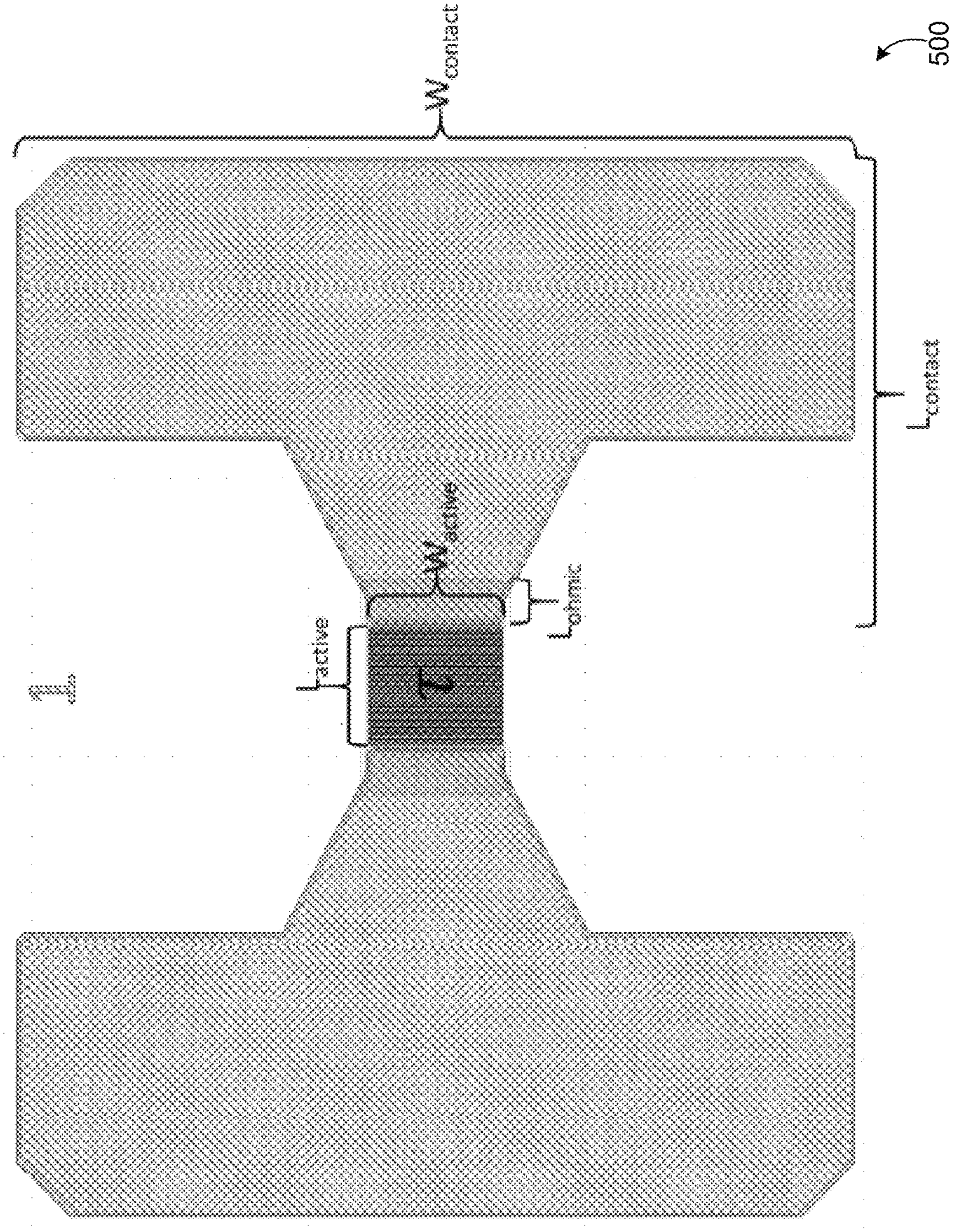
FIG. 5B illustrates a top view of a mask of an exemplary SPR device formed using a HEMT structure.
Figure 6A:
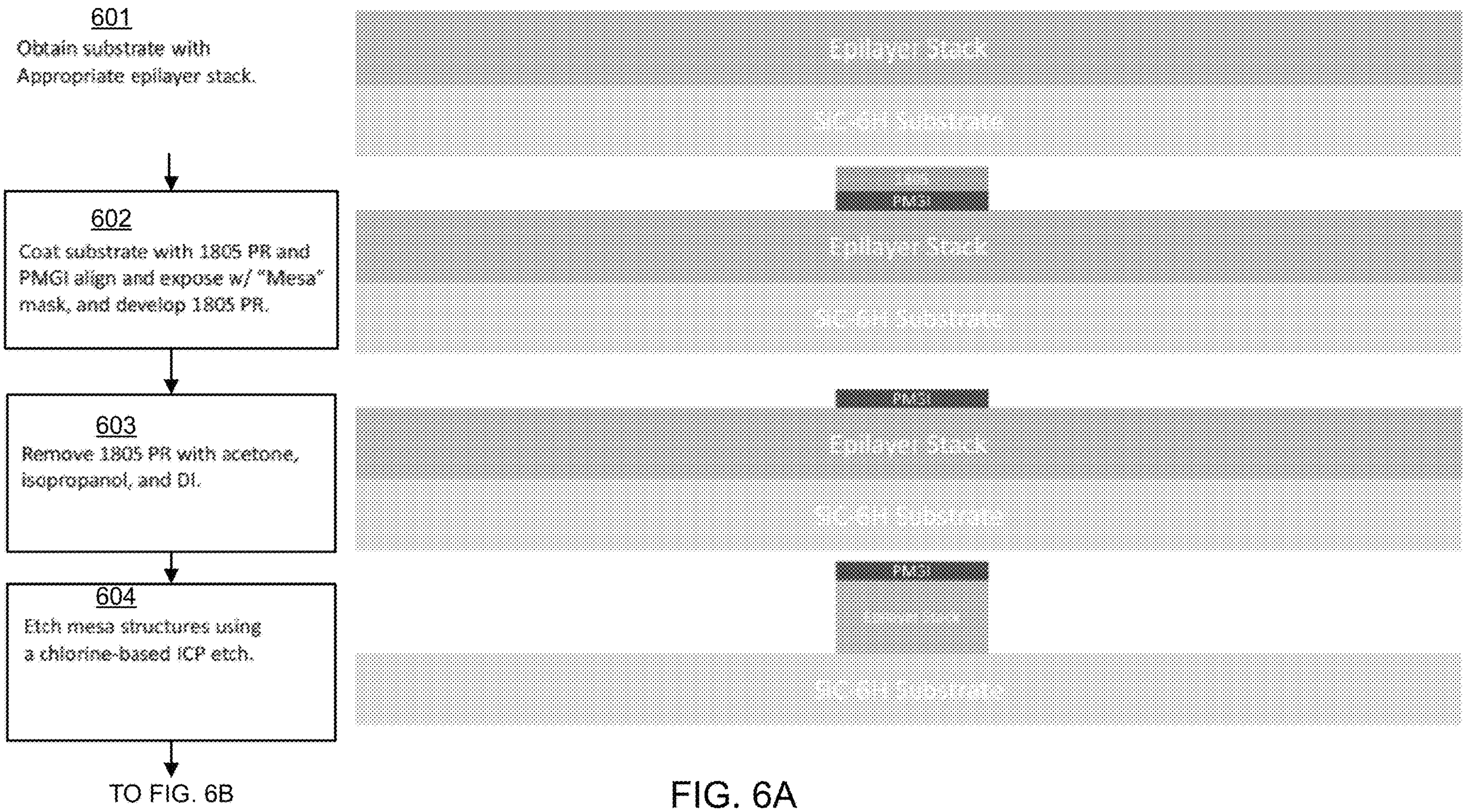
FIGS. 6A-6D illustrates respective portions of an exemplary sequence of semiconductor processes suitable for use in producing the device in accordance with an embodiment.
Figure 6B:
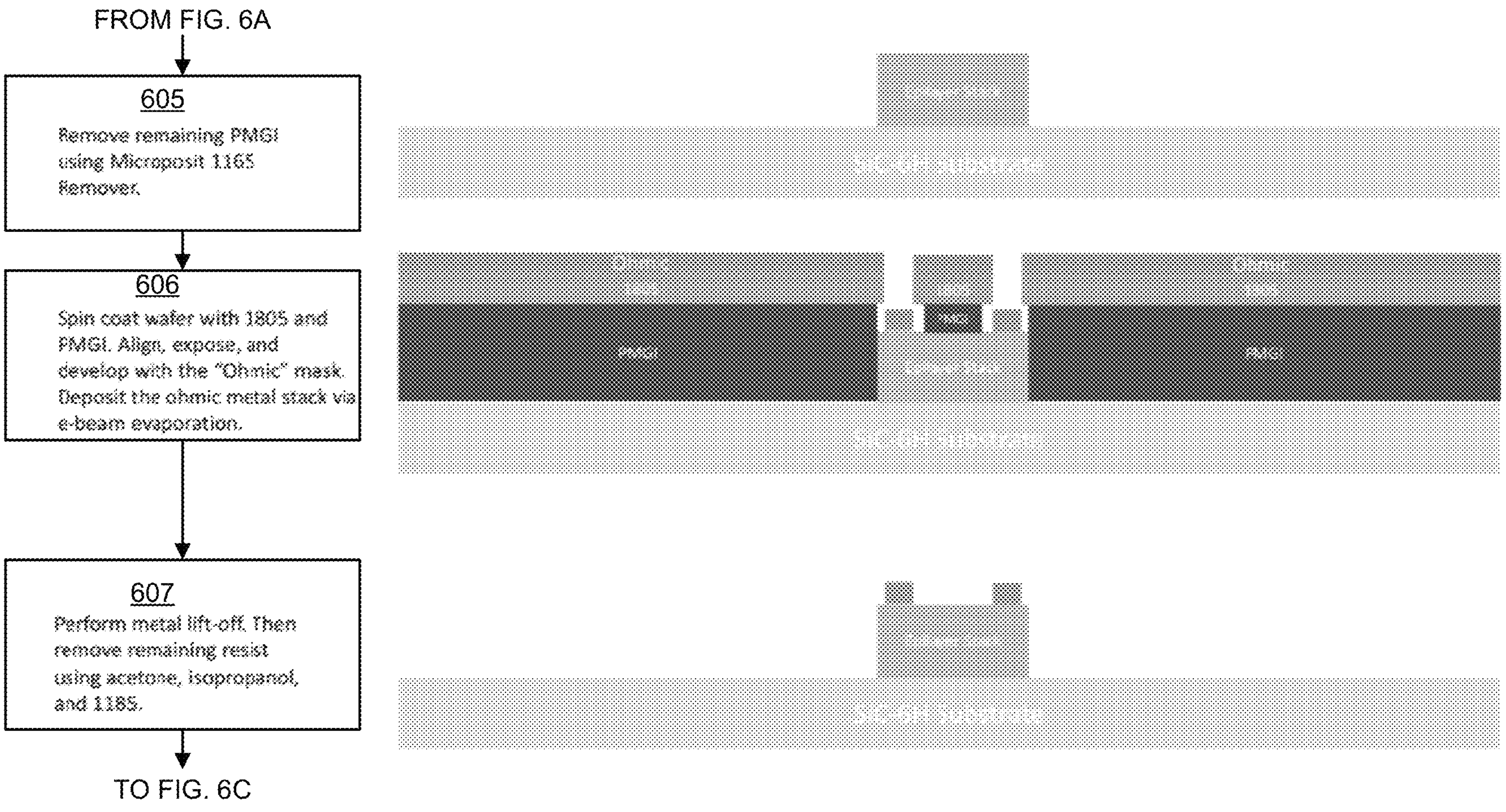
Figure 6C:
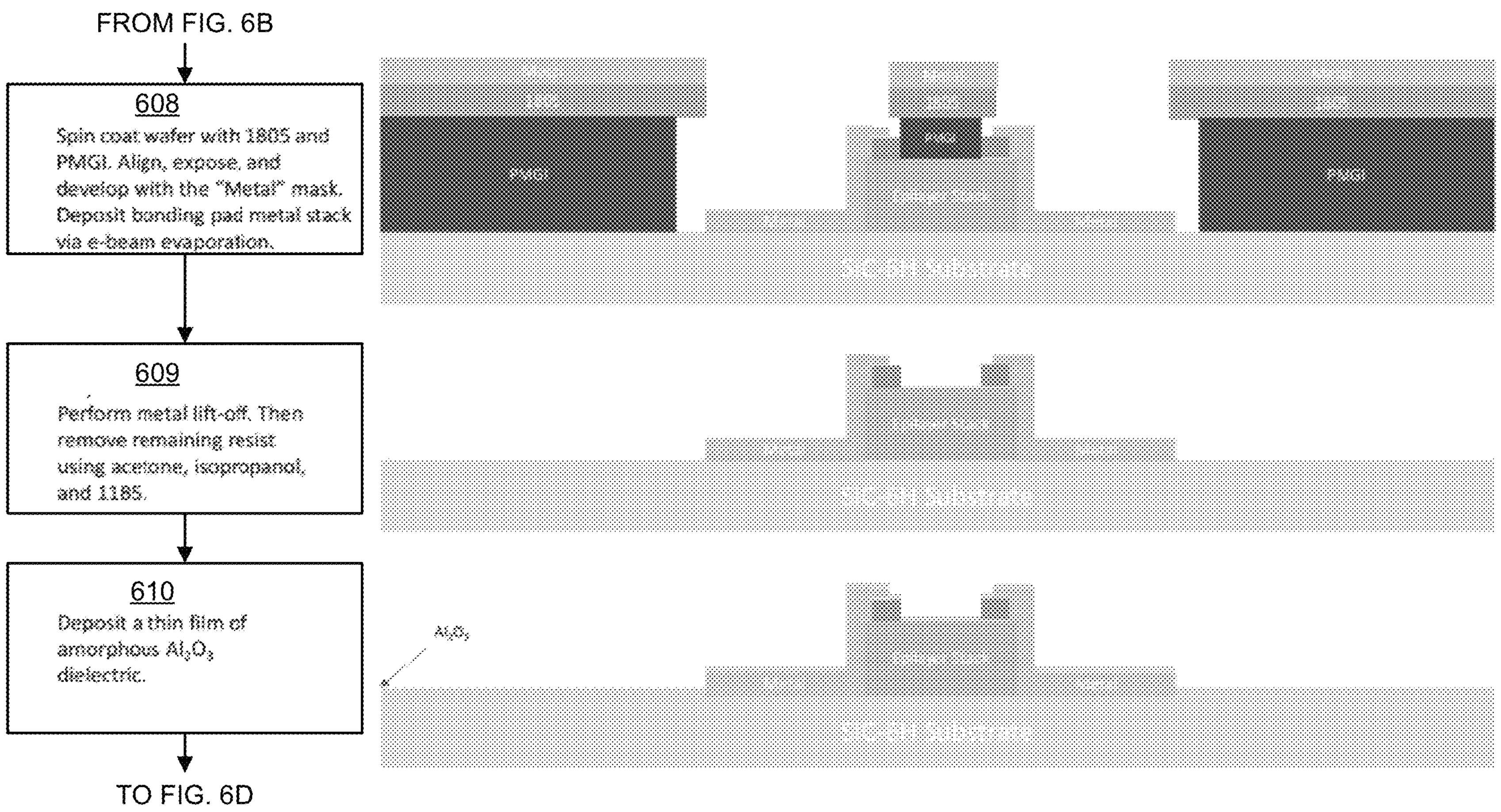
Figure 6D:
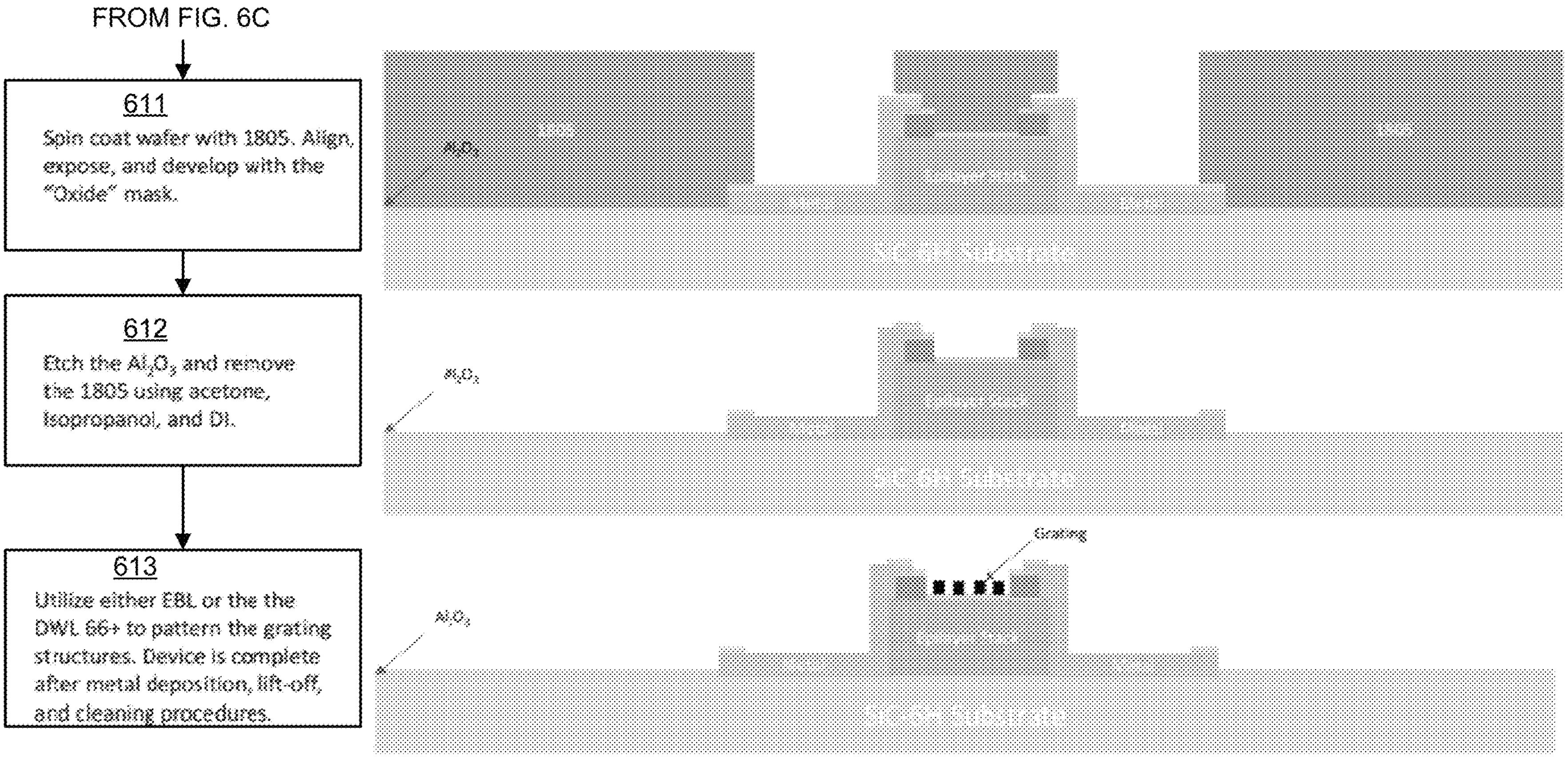

FIG. 5B depicts a top view of an exemplary mask of a SPR device formed using a HEMT structure. In particular, FIG. 5B depicts various dimensions of an SPR HEMT in accordance with various embodiments. Some, though not all, of exemplary first and second dimensions useful in the various embodiments are provided below with respect to Table 2 and Table 3.

TABLE 2

| Variation | Lactive (μm) | Wactive (μm) | Wcontact (μm) |
|---|---|---|---|
| 1 | 43.624 | 50 | 300 |
| 2 | 64.904 | 50 | 350 |
| 3 | 86.184 | 50 | 400 |
| 4 | 43.624 | 100 | 300 |
| 5 | 64.904 | 100 | 350 |
| 6 | 86.184 | 100 | 400 |
| 7 | 43.624 | 150 | 300 |
| 8 | 64.904 | 150 | 350 |
| 9 | 86.184 | 150 | 400 |

TABLE 3

| Constant Dimensions | |
|---|---|
| $\tau$ (μm) | 1.064 |
| $L_{ohmic}$ (μm) | 16 |
| $L_{contact}$ (μm) | 168 |

FIGS. 6A-6D illustrate respective portions of an exemplary sequence of semiconductor processing steps suitable for use in producing a device in accordance with an embodiment. It is noted that numerous and various semiconductor processing techniques may be used to implement the semiconductor processing steps depicted in FIGS. 6A-6D, as will be appreciated by those skilled in the art.

Figure 7A:
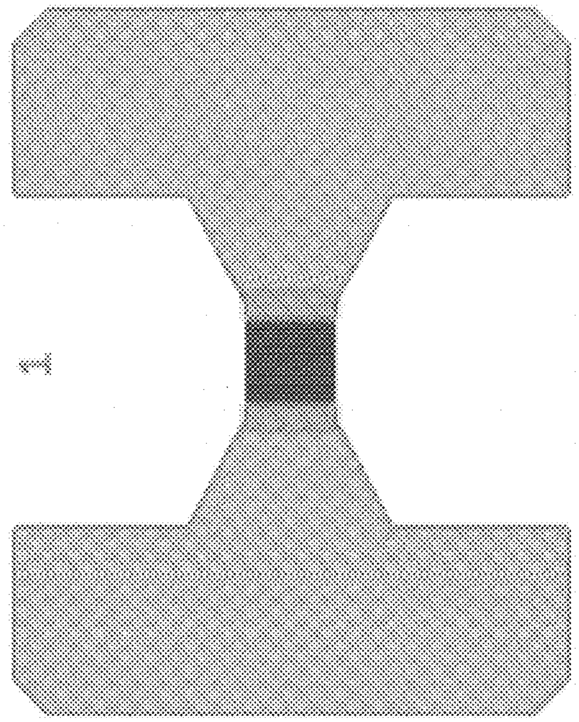
FIGS. 7A and 7B illustrate respective top and side cross sectional views of a completed device produced using the sequence of FIGS. 6A-6D.
Figure 7B:
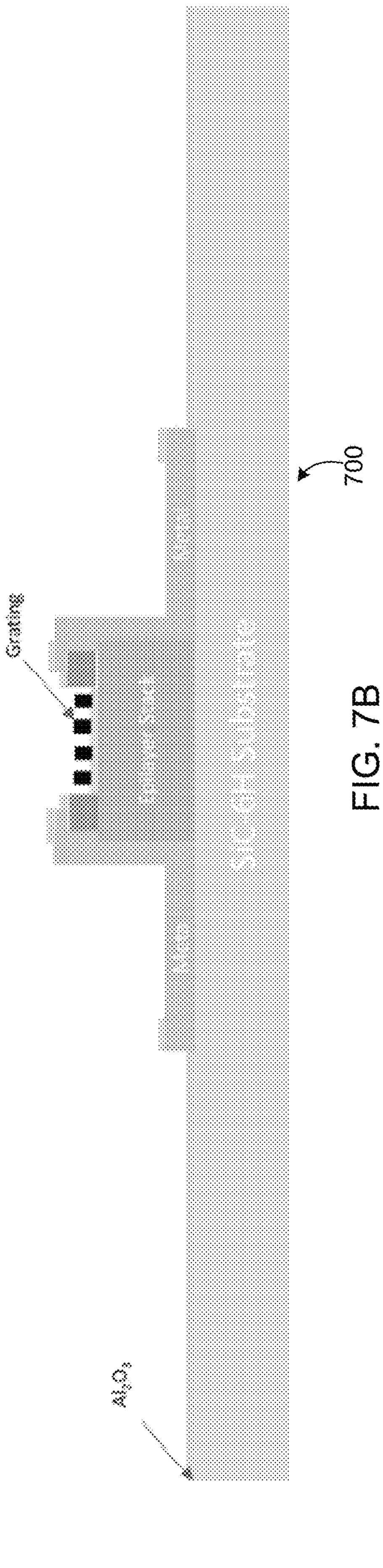

FIGS. 7A and 7B illustrate respective top and side cross sectional views of a completed semiconductor device produced in accordance with the semiconductor processing steps of FIGS. 6A-6D.

Various modifications may be made to the systems, methods, apparatus, mechanisms, techniques, and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

In the preceding detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical, and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

What is claimed is:

1. An electromagnetic (EM) radiation device comprising:

a high electron mobility transistor (HEMT) layered semiconductor structure having a drain and a source and configured to generate at a conducting channel of a buffer layer a two-dimension electron gas (2DEG) in response to a voltage applied between the drain and the source wherein the HEMT layered semiconductor structure further comprises:

a spacer interlayer disposed upon the buffer layer;

a barrier layer disposed upon the spacer layer;

a cap layer disposed upon the barrier layer;

a periodic metallic grating disposed upon the HEMT and configured to interact with the generated 2DEG to emit EM radiation in response to surface currents induced upon the periodic metallic grating by the 2DEG, the frequency of the EM radiation being determined by a grating period of the periodic metallic grating wherein the periodic metallic grating is disposed upon the cap layer directly above generated 2DEG; and the source and drain Ohmic contacts are configured to connect directly to generated 2DEG and comprise n++ GaN layers having a metal deposited thereupon and biased to operate the HEMT layered semiconductor structure in a depletion mode.

2. The EM radiation device of claim 1, wherein the buffer layer comprises a gallium nitride (GaN) layer less than approximately 1 μm thick; the spacer interlayer comprises an aluminum nitride (AlN) layer approximately 1 nm to 4 nm thick; the barrier layer comprises an aluminum gallium nitride (AlGaN) layer approximate 10 nm to 20 nm thick; and the cap layer comprises an insulating silicon nitride (SiN) layer.

3. The EM radiation device of claim 1, wherein the buffer layer comprises a gallium nitride (GaN) layer less than approximately 1 μm thick; the spacer interlayer comprises an aluminum nitride (AlN) layer approximately 1 nm to 4 nm thick; the barrier layer comprises a ScAlN layer approximate 10 nm to 25 nm thick; and the cap layer comprises an insulating silicon nitride (SiN) layer.

4. The EM radiation device of claim 1, wherein the conducting channel comprises an unintentionally doped (UID) GaN channel grown upon a buffer layer comprising a GaN/Si template.

5. The EM radiation device of claim 4, wherein the HEMT layered semiconductor structure further comprises a spacer interlayer disposed upon the buffer layer, a barrier layer disposed upon the spacer layer, and a cap layer disposed upon the barrier layer.

6. The EM radiation device of claim 5, wherein the barrier layer comprises a AlN layer.

7. The EM radiation device of claim 5, wherein the spacer interlayer comprises a AlN layer, and the barrier layer comprises a $Al_xGa_{1-x}N$ layer or $Sc_xAl_{1-x}N$ layer.

8. The EM radiation device of claim 4, wherein the HEMT layered semiconductor structure further comprises:

a barrier layer disposed upon the buffer layer, and a cap layer disposed upon the barrier layer.

9. An electromagnetic radiation source, comprising:

a high electron mobility transistor (HEMT) structure configured to generate a two-dimension electron gas (2DEG), comprising:

a layered semiconductor structure comprising:

a silicon carbide (SiC) substrate, a gallium nitride (GaN) buffer layer that is less than 1 μm thick and having a top portion that forms a conducting channel, an aluminum nitride (AlN) spacer interlayer that is approximately 3 nm thick, an aluminum gallium nitride (AlGaN) barrier layer having a thickness in a range of 10 to 20 nm, and a silicon nitride (SiN) cap that functions as an insulating layer;

source and drain Ohmic contacts configured to connect directly to generated 2DEG and consist of Au/Ti and n++ GaN layers biased to operate the layered semiconductor structure in depletion mode; and a periodic metallic grating disposed upon the SiN cap directly above generated 2DEG and having a period of grating that is selected according to a desired frequency of operation of the EM radiation source to combine a physical phenomenon of Smith-Purcell radiation with that of the 2DEG.

* * * * *